US006967982B2

(12) United States Patent
Wakisaka et al.

(10) Patent No.: US 6,967,982 B2
(45) Date of Patent: Nov. 22, 2005

(54) SEMICONDUCTOR LASER DEVICE WITH A STRAIN REDUCTION CUSHION FUNCTION, SEMICONDUCTOR LASER MODULE, AND SEMICONDUCTOR LASER DEVICE FABRICATION METHOD

(75) Inventors: Tsuyoshi Wakisaka, Tokyo (JP); Naoki Tsukiji, Tokyo (JP); Masayoshi Seki, Tokyo (JP); Junji Yoshida, Tokyo (JP); Yutaka Oki, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 267 days.

(21) Appl. No.: 10/322,664

(22) Filed: Dec. 19, 2002

(65) Prior Publication Data

US 2003/0151059 A1 Aug. 14, 2003

(30) Foreign Application Priority Data

Dec. 25, 2001 (JP) .............................. 2001-392346

(51) Int. Cl.$^7$ ................................................ H01S 5/00
(52) U.S. Cl. .................... 372/46.01; 372/43.01
(58) Field of Search ............................... 372/36, 43–46

(56) References Cited

U.S. PATENT DOCUMENTS

| | | | | |
|---|---|---|---|---|
| 3,946,334 A | * | 3/1976 | Yonezu et al. ................ 372/36 |
| 4,589,116 A | * | 5/1986 | Westermeier ................. 372/36 |
| 5,729,561 A | * | 3/1998 | Hironaka ....................... 372/36 |
| 6,212,212 B1 | * | 4/2001 | Honmou ........................ 372/43 |
| 6,474,531 B2 | * | 11/2002 | Ozawa ......................... 228/103 |
| 6,479,325 B2 | * | 11/2002 | Ozawa ......................... 438/119 |
| 6,720,581 B2 | * | 4/2004 | Ozawa ........................... 257/81 |
| 6,743,702 B2 | * | 6/2004 | Goto et al. .................. 438/518 |
| 6,761,303 B2 | * | 7/2004 | Ozawa ..................... 228/123.1 |
| 6,810,049 B2 | | 10/2004 | Wakisaka et al. | |
| 2002/0121863 A1 | * | 9/2002 | Morishita ................. 315/169.3 |
| 2002/0150134 A1 | * | 10/2002 | Kawai ........................... 372/36 |
| 2003/0020161 A1 | * | 1/2003 | Saitoh et al. ............... 257/706 |

* cited by examiner

*Primary Examiner*—Minsun Oh Harvey
*Assistant Examiner*—Phillip Nguyen
(74) *Attorney, Agent, or Firm*—Oblon, Spivak, McClelland, Maier & Neustadt, P.C.

(57) ABSTRACT

A semiconductor laser element is fixed onto a submount by forming a metallic thin film at a region on a surface of a p-side electrode of the semiconductor laser element. A periphery of the thin metallic thin film is recessed from a periphery of the p-side electrode by a predetermined width. The metallic thin film is thermally processed together with the p-side electrode for increasing a size of the grains and connected through a solder layer to the submount. Parts of the p-side electrode and the submount, the metallic thin film and the solder layer include Au for improving a cushion function of the semiconductor laser device.

39 Claims, 12 Drawing Sheets

20micron without sintering

20micron sintering temperature = 100 deg.C sintering temperature = 200 deg.C sintering temperature = 300 deg.C 20micron sintering temperature = 360 deg.C 20micron sintering temperature = 420 deg.C

SEMICONDUCTOR LASER DEVICE WITH A STRAIN REDUCTION CUSHION FUNCTION, SEMICONDUCTOR LASER MODULE, AND SEMICONDUCTOR LASER DEVICE FABRICATION METHOD

CROSS-REFERENCE TO RELATED APPLICATION

This application is based upon and claims the benefit of priority from Japanese Patent Application No. 2001-392346, filed Dec. 25, 2001, the entire contents of which are incorporated herein by reference.

BACKGROUND OF THE INVENTION

1. Field of the Invention

The present invention relates to a semiconductor laser device, a semiconductor laser module, and a semiconductor laser device fabrication method.

2. Discussion of the Background

In recent years, as the Internet becomes more popular, connections between LAN networks have rapidly increased, and therefore a sharp increase of data traffic has been observed, posing a problem in terms of communication performance. Thus, a DWDM (Dense-Wavelength Division Multiplexing) transmission system to prevent the communication performance from deteriorating has been proposed.

The DWDM transmission system realizes large-capacity data transmission, two orders of magnitude greater per fiber than a conventional system, by superimposing a plurality of optical signals with various wavelengths. A signal light source or amplification light source used for the DWDM transmission system is required to control an oscillation wavelength with a high accuracy at high optical output while preventing a thermal saturation of the semiconductor laser element. Conventionally, a semiconductor laser device achieves these results by monitoring and controlling a temperature of the laser element. More specifically, for preventing the wavelength of the electromagnetic wave from becoming unstable and the semiconductor laser element from becoming thermally saturated, a thermistor is set to measure the temperature of the semiconductor laser element that outputs a laser beam, and control the temperature of the semiconductor laser element by a temperature control element, such as a Peltier element.

FIG. 16 is a perspective view that shows a schematic structure of a conventional semiconductor laser device. In FIG. 16, the semiconductor laser device has a submount 102 made of AlN having an insulating property and a high heat conductivity. The submount 102 is set on a carrier 101 made of CuW. A semiconductor laser element 103 that outputs a laser beam L100 having a predetermined wavelength is set on the submount 102. Moreover, a submount 104 made also of AlN is set on the carrier 101, and a thermistor 105 that measures the temperature of the semiconductor laser element 103 is set onto the submount 104.

Therefore, the submount 102 secures the insulation of the semiconductor laser element 103 and functions as a heat sink of the semiconductor laser element 103. The submount 102 is connected to a CuW base (not shown) connected by AuSn solder below the carrier 101 and to a Peltier module (not shown) disposed below the base for controlling the temperature of the semiconductor laser element 103 in accordance with the temperature detected by the thermistor 105. The thermistor 105 is also insulated from the carrier 101 by the submount 104, similarly as the semiconductor laser element 103. The thermistor 105 indirectly detects the temperature of the semiconductor laser element 103 through the submount 102, carrier 101, and submount 104, respectively.

For the above DWDM transmission system, it is desired to increase the output of the laser beam of the signal light source in order to increase a distance between repeaters necessary for connecting various LANs. Moreover, to improve the amplification of an optical fiber amplifier, it is desired to increase the output of the semiconductor laser device used in an excitation light source. To increase the output of the laser beam of the semiconductor laser device, it is known that increasing the cavity length of the semiconductor laser element 103 and improving the radiation characteristic of the semiconductor laser element achieve this result. However, because the increase of the cavity length causes the increase of heat generation, an improvement of the radiation characteristic is the preferred method for increasing the output of the laser element. One way to improve the radiation efficiency and output power of the laser element 103 is by forming the submount 102 from a material such as diamond, which has a high radiation characteristic, and arranging the semiconductor laser element 103 in a junction-down configuration.

However, the diamond made submount 102 causes reliability problems for the laser element 103. Specifically, a repeated heat generation by the semiconductor laser element 103 and cooling by the submount 102 make the characteristics of the semiconductor laser element 103 deteriorate, and the element 103 may break due to the strain produced by the difference between linear expansion coefficients of the diamond submount 102 and the semiconductor laser element 103. In other words, using a diamond submount 102 for improving the thermal characteristics of the laser device causes an undesirable mechanical strain between the submount 102 and the laser element 103.

SUMMARY OF THE INVENTION

A first object of this invention is to provide a semiconductor laser element including an active layer disposed between first and second electrodes that inject a current into the active layer, a first metallic thin film layer provided on a surface of the second electrode, a submount having electric insulating and high thermal conductivity properties, the submount having a second metallic thin film layer provided on a surface of the submount, and a solder layer configured to connect the first metallic thin film layer to the second metallic thin film layer. The second electrode, the first metallic thin film layer, the solder layer, and the second metallic thin film layer each comprises Au, and the second electrode, the first metallic thin film layer, the solder layer, and the second metallic thin film layer form a structure having a total thickness of 5 to 25 µm.

Further, the multilayer structure includes a gold layer in contact with the first metallic thin film layer and the first metallic thin film layer is an electrolytic plating film of substantially pure Au, and has a thickness of at least 1 µm. In addition, the first metallic thin film layer has a thickness in the range of 2–9 µm or the first metallic thin film layer has a thickness of about 6 µm.

The first metallic thin film layer includes a flat shape having a periphery recessed from a periphery of the second electrode, and has a convex portion on a light emitting end or on a light reflecting end in a longitudinal direction of the laser device, and the second electrode, the first metallic thin film layer, the solder layer, and the second metallic thin film layer form a structure having a total thickness of 5 to 25 μm.

Another object of the present invention is to provide a semiconductor laser device including a semiconductor laser element including an active layer disposed between first and second electrodes that inject a current into an active layer, a first metallic thin film layer provided on a surface of the second electrode, a submount having electric insulating and high thermal conductivity properties, the submount having a second metallic thin film layer provided on a surface of the submount and a solder layer configured to connect the first metallic thin film layer to the second metallic thin film layer so that a periphery of the first metallic thin film layer is recessed from a periphery of the second electrode layer by a predetermined amount.

Further, the second electrode, the first metallic thin film layer, the solder layer, and the second metallic thin film layer form a structure having a total thickness of 5 to 25 μm, and the second electrode layer is a multi-layer structure having a thickness of 0.5 μm or less.

Still another object of the present invention is to provide a fabrication method for a semiconductor device including supplying a p-type electrode, depositing a first metallic thin film on a side of the p-type electrode, the side facing a substrate, thermally processing the first metallic thin film and the p-type electrode at a predetermined temperature for a predetermined time, and cooling down the first metallic thin film and the p-type electrode so that the p-type electrode and the first metallic thin film include Au.

Further, at least one metallic thin film of the plurality on metallic thin films contains Au and the supplying a p-type electrode includes polishing substrate and forming an n-type electrode. In addition, the thermally processing step includes thermally processing the n-type electrode.

Another object of the present invention is to provide a semiconductor laser module including a semiconductor laser element as described above a temperature-measuring element which measures a driving temperature of the semiconductor laser element, and a temperature control element which controls a temperature of the semiconductor laser device in accordance with a temperature output from the temperature-measuring element, so that the submount is connected to an upper part of the temperature control element and the temperature of the semiconductor laser device is controlled through the submount.

DETAILED DESCRIPTIONS

Embodiments of the semiconductor laser device and the semiconductor laser module of the present invention are described below in detail by referring to the accompanying drawings. The present invention is not limited to these embodiments.

First Embodiment

The semiconductor laser device of the first embodiment has an electrode of a metallic thin film serving as a buffering layer, a solder layer serving as a conductive adhesive, and a metallic thin film on a submount serving as a wiring extension layer, each of which include Au and are arranged in the above described sequence.

Figure 1A:
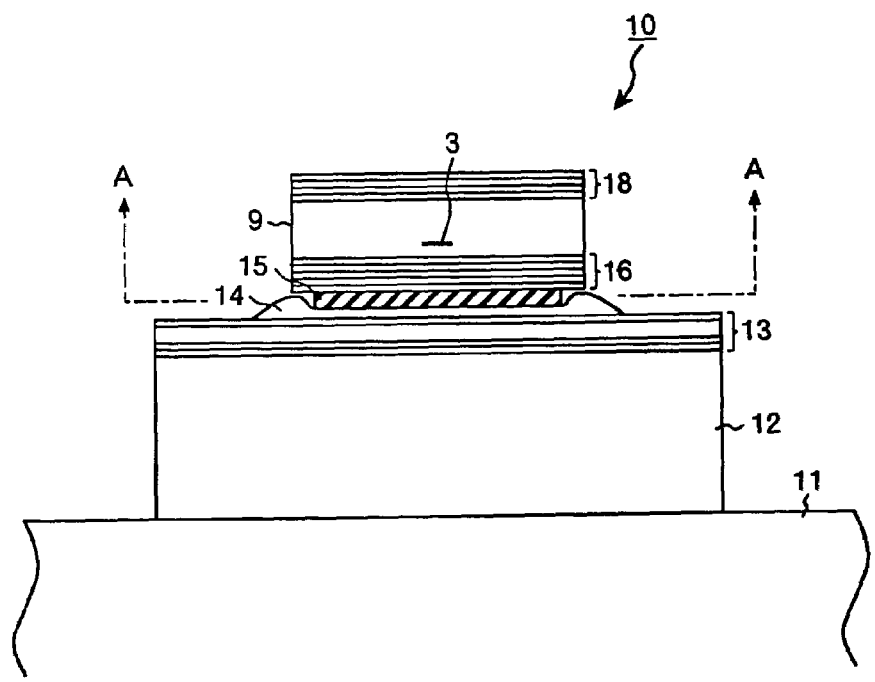
FIG. 1A is a sectional view which shows a structure of a semiconductor laser device.
Figure 1B:
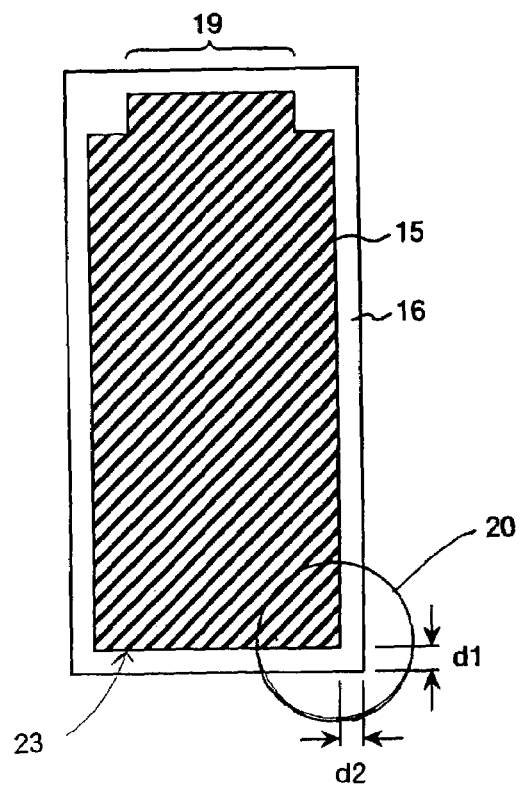
FIG. 1B is a top view along line A—A of FIG. 1A, which shows a p-side electrode of the laser device and a recessed layer.
Figure 1C:
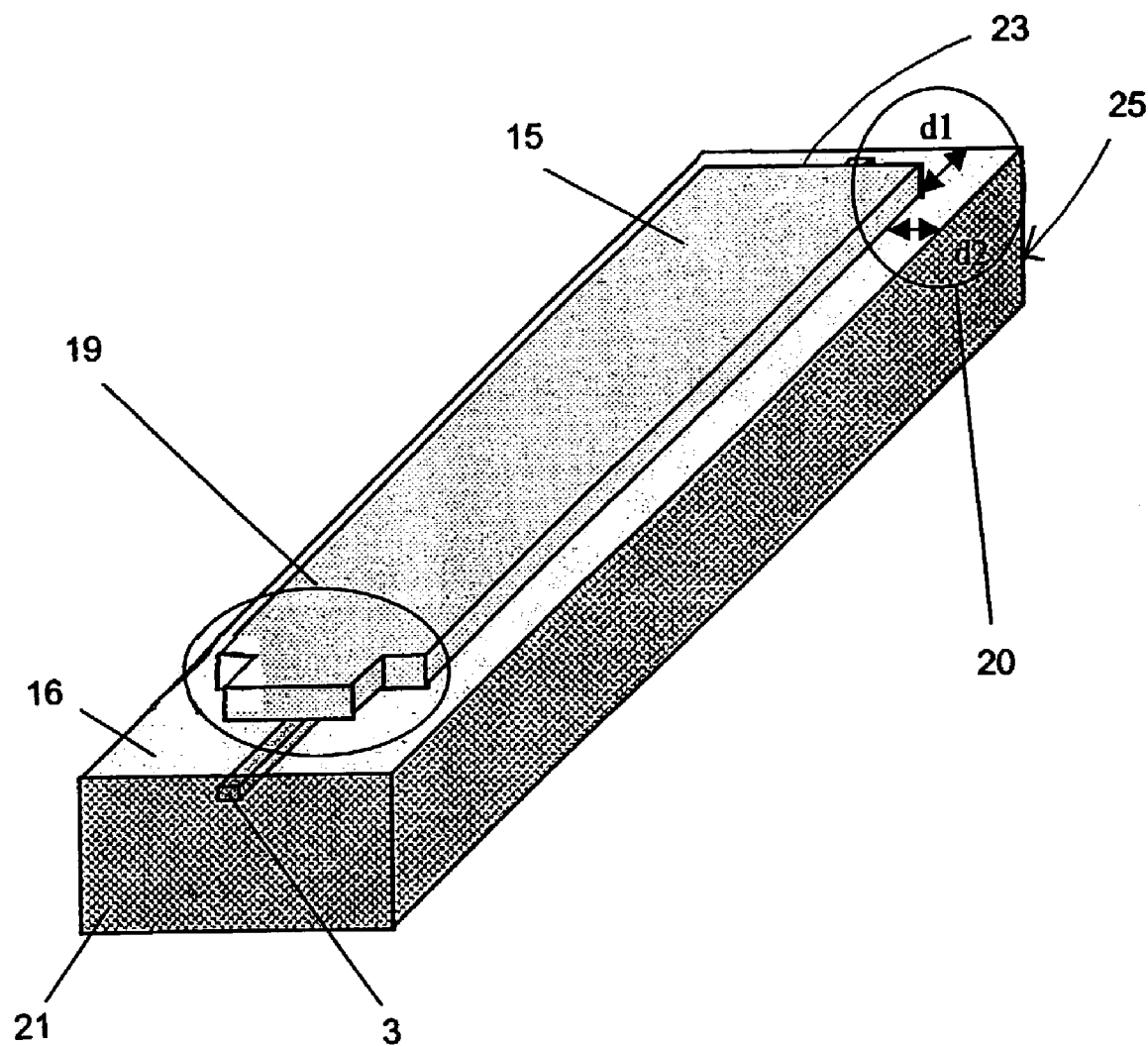
FIG. 1C is a perspective view of the semiconductor laser which shows the p-side electrode of the laser device and the recessed layer.

FIGS. 1A, 1B and 1C illustrate a structure of the semiconductor laser device of the first embodiment. Particularly, FIG. 1A shows a sectional view of the semiconductor laser device in which a vertical direction to the paper surface coincides with a laser-beam emitting direction, FIG. 1B shows a sectional view taken along the line A—A in FIG. 1A, and FIG. 1C shows a perspective view of the semiconductor laser element. In FIG. 1A, the semiconductor laser device 10 has a submount 12 made of diamond, which has a good insulating characteristic and a high thermal conductivity. The submount is disposed on a carrier 11 made of AlN or the like, and a semiconductor laser element 9 that outputs a laser beam of a predetermined wavelength is disposed on the submount 12.

As shown in FIG. 1A, a p-side electrode layer 16 is formed on one surface side of the semiconductor laser element 9, and an n-side electrode layer 18 is formed on the opposite surface side of the laser element 9. The semiconductor laser element 9 can use a semiconductor laser element of InP-based 1.48 μm band oscillation and it is preferable that a cavity length is 800 μm or more in order to realize a high output. A metallic thin film 15 is formed on a surface of the p-side electrode layer 16 and a metallic thin film 13 is formed on the submount 12 facing the semiconductor laser element 9. A solder layer 14 is applied onto the metallic thin film 13, which is bonded through the solder layer 14 to the metallic thin film 15 of the semiconductor laser element 9. Thereby, the semiconductor laser element 9 is fixed to the submount 12 and an electrode wiring can be extended from the p-side electrode layer 16 via the metallic thin film 13. The semiconductor laser element 9 is fixed through the above described junction-down method with the active layer 3 located nearby the p-side electrode layer 16.

As discussed above, a diamond submount improves a radiation characteristic of the semiconductor laser device, but increases a mechanical strain between the submount and the laser element. The present invention advantageously uses a metallic thin film containing Au between the diamond submount and the laser element for reducing the mechanical strain. The shape and structure of the metallic thin film are responsible for alleviating the mechanical strain.

The shape of the metallic thin film 15 is described next. As shown in FIG. 1B, the metallic thin film 15 is not formed on the entire surface of the p-side electrode layer 16, but rather is formed on a recessed region 20 away from an end of the p-side electrode layer 16 by predetermined widths d1 and d2. The longitudinal-directional width d1 and transverse-directional width d2, in FIGS. 1A and 1B, may be equal to or different from each other. When the widths d1 and d2 are equal to each other, they are set to 25 $\mu$m, for example. Moreover, when the semiconductor laser element 9 is integrated with the metallic thin film 15, a front end along a longitudinal-direction of the metallic thin film 15 is formed into a convex shape 19.

The present inventors have discovered that by having a region of the p-side electrode layer 16 free of the metallic thin film 15, i.e., the metallic thin film 15 is not present on the outer margin of the surface of the p-side electrode layer 16, it is possible to eliminate strains among the metallic thin film 15, the submount 12, and the p-side electrode layer 16. That is, the present inventors recognized that the strains mainly concentrate on the end of the metallic thin film 15 and, due to the recessed structure 20, the strain produced because of the difference between linear expansion coefficients among various layers is reduced. Therefore, it is possible to protect an end surface of the semiconductor laser element 9 that has a relatively low strength. Moreover, because the metallic thin film 15 does not contact the emission end surface of the semiconductor laser element 9, it is possible to easily and securely cleave the emission end surface of the laser element 9.

FIG. 1C shows a perspective view of the semiconductor laser element described above. The first metallic thin film 15 is in contact with the p-side electrode 16 and the convex portion 19 of the metallic thin film 15 determines a region on the p-side electrode layer 16 free of the metallic thin film 15. The convex portion 19 corresponds to a back face 21 of the semiconductor laser device, which is coated with a high reflection film, and the flat side 23 of the metallic thin film 15 corresponds to a front face 25 of the semiconductor laser device, which is coated with an antireflection film. The widths d1 and d2 are either the same or different and define an area on the p-side electrode layer 16 that is free of the metallic film 15.

Figure 2:
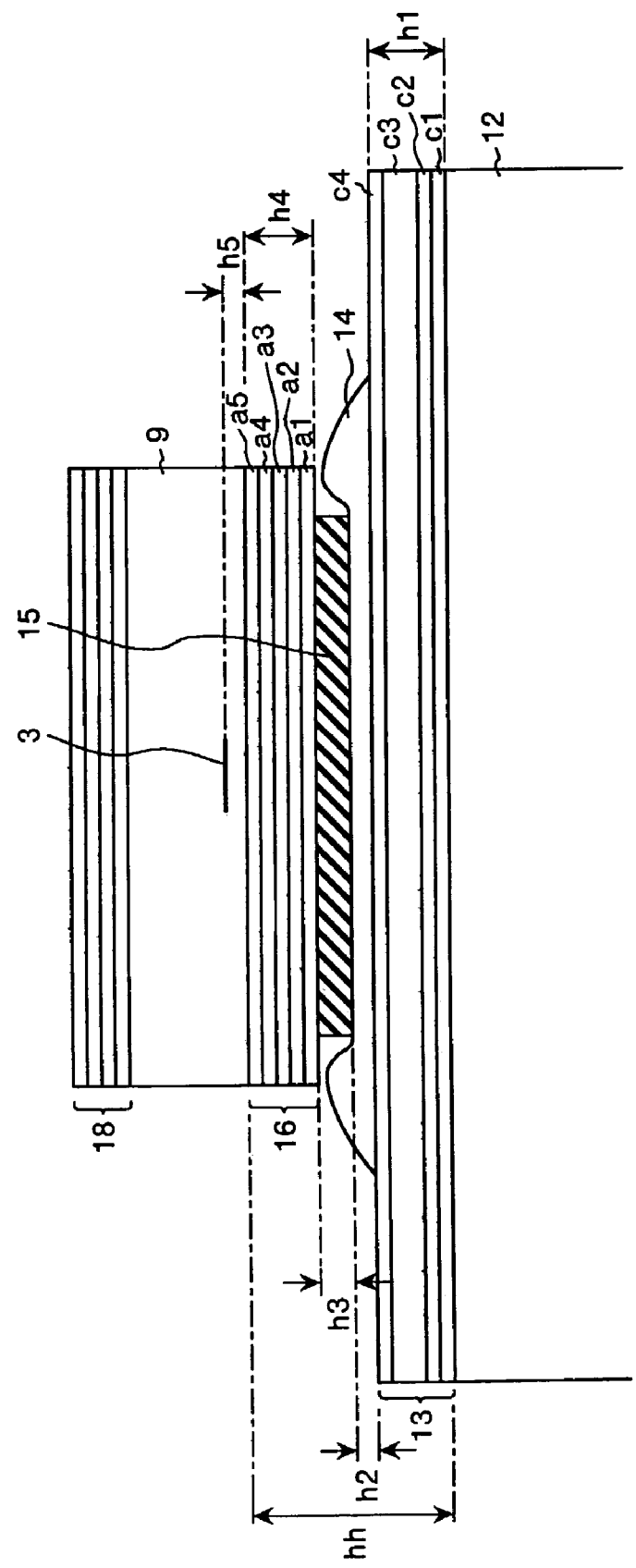
FIG. 2 is an enlarged view of the connective section between a semiconductor laser element and a submount.

Materials and thicknesses of the p-side electrode layer 16, metallic thin film 15, solder layer 14, and metallic thin film 13 are described with respect to FIG. 2. FIG. 2 is an enlarged view of the connective section between the semiconductor laser element 9 and the submount 12. Elements in FIG. 2 that were described in FIG. 1 have the same reference designation as shown in FIG. 1, and description of these elements is not repeated.

In FIG. 2, the p-side electrode layer 16 has a multi-layer structure in which a plurality of metallic films are laminated, and at least a metallic film contacting the metallic thin film 15 contains Au. The p-side electrode layer 16 shown in FIG. 2, for example, is formed by five metallic films a1 to a5 These metallic films do not have the same composition for adjacent metallic films, but two metallic films that are not in direct contact may have the same composition. For example, it is possible to form the metallic films a1 and a5 of Au. Moreover, it is preferable that the plurality of metallic films a1–a5 are formed so that a combination of their compositions prevents the metallic films from being deteriorated due to electromigration among the metallic films, and so that a total thickness of the films, i.e., a thickness h4 of the p-side electrode layer 16, is a value that minimizes a thermal resistance and an electric resistance. For example, the thickness h4 of the p-side electrode layer 16 is set to 0.5 $\mu$m or less.

The metallic thin film 15 is formed by electrolytic plating of the laser element 9 with Au, which, as mentioned, has a low electrical resistance. Making the metallic thin film 15 out of the same material as the metallic layer a1 on the outermost surface of the p-side electrode layer 16 ensures a stable connective state with the p-side electrode layer 16. Moreover, Au (particularly pure Au) is soft and a film obtained through electrolytic plating is coarse in texture compared to that obtained through sputtering or vapor deposition. Therefore, it is possible to make the thin film 15 have a strain reduction cushion function for adhesion with the solder layer 14. That is, when the semiconductor laser element 9 integrated with the metallic thin film 15 is fixed onto the submount 12 through the solder layer 14, a pressure between the submount 12 and laser element 9 is evenly distributed due to the malleable nature of the gold film 15. Thereby, it is possible to prevent the semiconductor laser element 9 from breaking when fixed to the submount 12.

It is also preferable to set a thickness h3 of the metallic thin film 15 to a value at which a thermal resistance or electric resistance is not greatly increased while securing the above described cushioning function. Specifically, it is preferable to set the thickness h3 of the metallic thin film 15 to at least 1 $\mu$m or more, and particularly preferable to set h3 in a range between 2 and 9 $\mu$m. Moreover, the most preferred value of the thickness h3 of the metallic thin film 15 is 6 $\mu$m.

The strain reduction function of the metallic thin film can be further improved by producing the metallic thin film with a high grain size. To achieve this result, a semiconductor laser device fabrication method includes a step of thermally processing the metallic thin film 15 after forming the metallic thin film 15 on the laser element 9. Due to the thermal processing step, the grain size of the Au in the metallic thin film 15 is increased and the above cushioning effect is improved, as will be further described below.

The solder layer 14 serving as the conductive adhesive is formed of Au-based materials such as AuSn or the like. Particularly, because an Au-based material is soft and has a low electric resistance as described above, it is possible to thicken the solder layer 14 so as to have a similar cushioning function as the metallic thin film 15, and also to moderate a strain among various layers. The eutectic temperature of the solder layer 14 depends on the composition of the material used to form the layer 14. When the eutectic temperature rises, that is, when a temperature difference between the eutectic temperature and an ordinary operating temperature is large, the thermal expansion difference between the semiconductor laser element 9 and the submount 12 also increases and the strain applied to the semiconductor laser element 9 is high. Therefore, it is preferable to determine a composition of the solder layer 14 so that the eutectic temperature is relatively low. For example, when AuSn is used for the solder layer 14, it is preferable to set the ratio of Au:Sn to 74–80:26–20.

It is preferable to set the thickness of the solder layer 14 to a value at which an electric resistance and a thermal resistance are minimized, and a conducting function and a bonding function are sufficiently performed. For example, when using AuSn for the solder layer 14, the thickness of the solder layer is set to 3.5 $\mu$m±20% (2.8 to 4.2 $\mu$m), just before fixing the semiconductor laser element 9, and the thickness h2 becomes approximately 1 $\mu$m after the semiconductor laser element 9 has been fixed to the submount 12. The change in thickness of the solder layer 14 is accounted by a pressing of the semiconductor laser element 9 towards the submount 12, which greatly increases a mechanical strain on the laser element 9. As noted above, having the thin metallic layer 15 between the semiconductor laser element 9 and the submount 12 allows the semiconductor laser element 9 to withstand the applied pressure, and due to the Au composition of the metallic thin layer 15, the pressure-load applied on the semiconductor laser element 9 is distributed uniformly so that a breakage of the semiconductor laser element 9 is prevented. Moreover, using the Au-based metallic thin layer 15 and other Au-containing layers on the diamond submount 12 and the semiconductor laser element 9 advantageously achieves a reduction in the mechanical strain developed in the laser element when repeatedly undergoing temperature changes.

The metallic thin film 13 has a multi-layer structure in which a plurality of metallic films are laminated, and is formed by including metallic films containing Au. The metallic thin film 13 shown in FIG. 2 is, for example, formed by four metallic films c1 to c4 and the metallic film c3 is made of Au. These metallic films are formed so that adjacent metallic films have different composition from each other, but non-adjacent metallic films may have the same material composition. For example, the metallic films c2 and c4 may both be formed of Pt.

Moreover, it is preferable that the plurality of metallic films c1–c4 are formed so that a combination of material compositions prevents a deterioration due to electromigration between metallic films, and so that a thickness of the metallic film containing Au becomes larger than a total thickness of the other metallic films. With the above example, the thickness of the metallic film c3 containing Au is set to 2 $\mu$m and the total thickness of other metallic films c1, c2, and c4 is set to approximately 0.5 $\mu$m. With this structure of the metallic thin film 13, advantages such as the low electric resistance and a strain reducing cushioning function are obtained by using Au as a main material.

The thicknesses of the p-side electrode 16, metallic thin film 15, solder layer 14, and metallic thin film 13 were described above. It is also preferable that the total thickness hh of the p-side electrode 16, metallic thin film 15, solder layer 14, and metallic thin film 13 ranges between 5 and 25 $\mu$m so that the radiation effect of the diamond submount 12 is sufficiently high. Moreover, it is preferable to set a width h5 between the active layer 3 and the p-side electrode layer 16 so as not to be influenced by a thermal strain while obtaining a good radiation effect by the submount 12. Specifically, the optimum value of the width h5 is 4 $\mu$m. Finally, it is desirable that the n-side electrode layer 18 is constituted by laminating a plurality of different metallic films.

According to the semiconductor laser device of FIGS. 1A–1C and 2, it is possible to reduce influences of the thermal stress on an end of the semiconductor laser element 9 and prevent acceleration of deterioration and breakdown of the semiconductor laser element 9 due to the heat generated in the active layer 3 or the heat generated when fixing the semiconductor laser element 9 onto the submount 12. These advantages are achieved by a shape of the metallic thin film 15 formed between the p-side electrode layer 16 of the semiconductor laser element 9 and the submount 12 on a region of the p-side electrode layer 16, i.e., the metallic thin film 15 is recessed from the p-side electrode layer 16, by predetermined widths.

Moreover, because the p-side electrode layer 16 of the semiconductor laser element 9, the metallic thin film 15, the solder layer 14, and the metallic thin film 13 on the submount 12 are arranged in this order and formed by respectively including an Au-based material, it is possible to provide a strain reducing action for each layer and protect the semiconductor laser element 9 when pressed and fixed against the submount 12. Furthermore, because an Au-based material has a low electric resistance and a low thermal resistance, the thermal conduction from the semiconductor laser element 9 to the submount 12 is improved, a higher radiation effect by the submount 12 is obtained and a semiconductor laser device having a stable and long service life is achieved. In addition, a strain reduction cushion function can be further improved if the coefficient of linear expansion of a layer increases from the submount 12 towards the p-side electrode layer 16.

While the first embodiment of the invention was described with respect to a junction-down configuration, one of ordinary skill in the art would understand that it is also possible to apply the present invention when employing the so-called junction-up structure.

Figure 3:
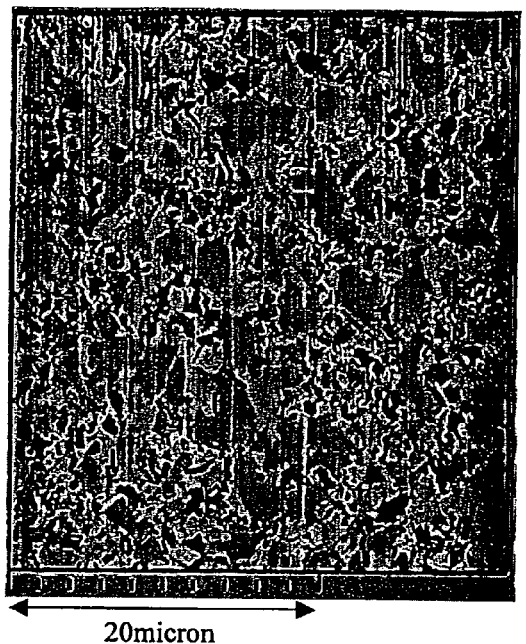
FIG. 3 is an enlarged view showing a grain size of a metallic thin film thermally processed at room temperature.

As noted above, another parameter that influences the strain reduction cushion function is the grain size of the material. A high size grain is desirable for the metallic thin film 15 used in this embodiment in order to increase the strain reduction cushion function and the temperature dissipation from the laser element 9 to the submount 12. FIG. 3 is a microscopic image of the metallic thin film 15 when no thermal treatment has been applied. As seen in this Figure, the grain size of the metallic thin layer 15 is considerably smaller than 20 $\mu$m. The present inventors have recognized that the metallic thin layer 15 may be thermally treated by sintering at various temperatures in order to increase the size of the grain of the metallic thin film 15.

Figure 4:
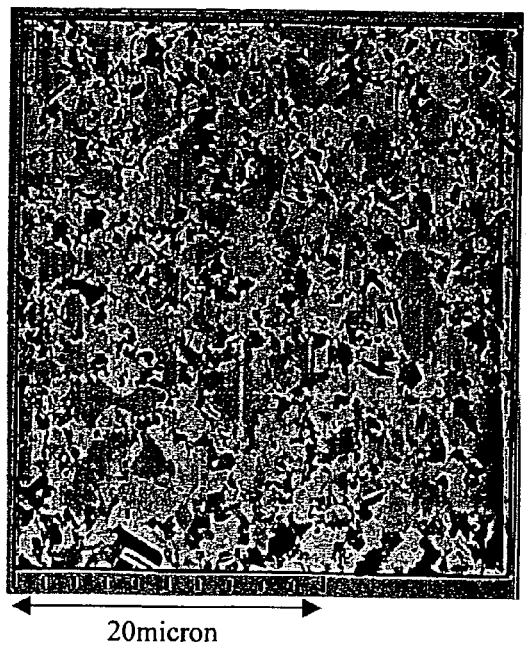
FIG. 4 is an enlarged view showing the grain size of the metallic thin film thermally processed at 100° C.
Figure 5:
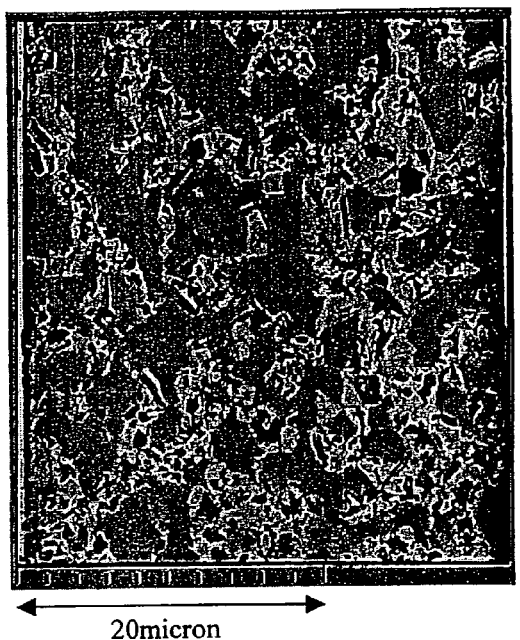
FIG. 5 is an enlarged view showing the grain size of the metallic thin film thermally processed at 200° C.
Figure 6:
FIG. 6 is an enlarged view showing the grain size of the metallic thin film thermally processed at 300° C.
Figure 7:
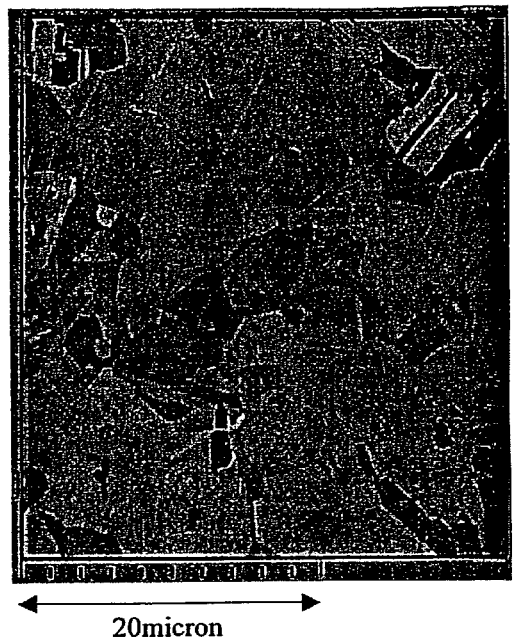
FIG. 7 is an enlarged view showing the grain size of the metallic thin film thermally processed at 360° C.
Figure 8:
FIG. 8 is an enlarged view showing the grain size of the metallic thin film thermally processed at 420° C.

FIGS. 4–8 show the grain sizes for the metallic layer 15 as the sintering temperature is increased from 100° C. to 420° C. The grain size is measured by drawing a straight line in a certain direction, for example horizontal in FIG. 8, measuring the length of the line, counting the number of grains intersected by the line, and dividing the length of the line by the number of the counted grains. As shown in FIGS. 4–8, the grain size increases as the sintering temperature increases. In particular, as shown in FIGS. 4 and 5, sintering at 100° C. and 200° C. result in a marginal increase in grain size. However, as shown in FIG. 6, if the sintering temperature is 300° C., early crystallization occurs at the wall area of the metallic thin film and grains with a larger size are obtained. FIGS. 7 and 8 further demonstrate the recrystallization that occurs at the first metallic thin film 15 with sintering at 360° C. and 420° C. respectively. As noted above, a larger grain size is preferable to reduce mechanical strains on the laser device. Thus, it is preferable the metallic thin film 15 is sintered at a temperature above 300° C. in order to increase the strain reduction cushion action.

Figure 9:
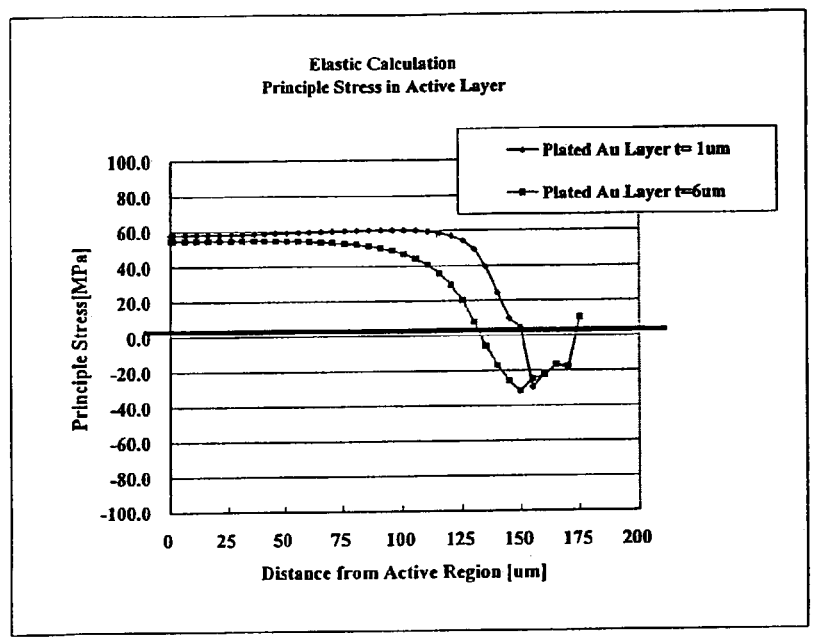
FIG. 9 is a graph illustrating a mechanical stress in the active layer versus a distance from a center of the active layer when a width of an Au layer is 1 μm and 6 μm, at room temperature.
Figure 10:
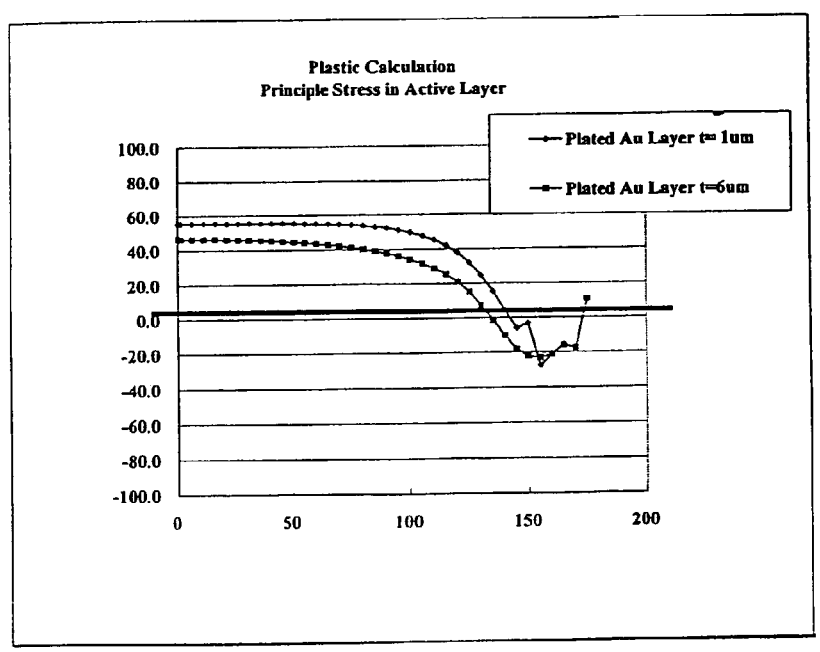
FIG. 10 is a graph illustrating the mechanical stress in the active layer versus a distance from the center of the active layer when the width of the Au layer is 1 μm and 6 μm, at a temperature of 400° C.

FIGS. 9 and 10 illustrate the effect of sintering on the thermal stress of a laser device. Specifically, FIG. 9 shows the principle stress at various distances from the active region as an unsintered laser device 10 is cooled from 325° C. to 25° C. FIG. 10 plots the same information as FIG. 9, but for a laser device 10 sintered at 400° C. for 1 minute. Moreover, FIGS. 9 and 10 each plot stress data for 1 $\mu$m and 6 $\mu$m thickness metallic film 15. As seen in FIG. 9, a principle stress at the active region of the unsintered device was 58.212 MPa for the 1 $\mu$m device, and 54.684 MPa for the 6 $\mu$m device. For the sintered device shown in FIG. 10, the principle stress at the active region was 55.55 MPa for the 1 $\mu$m device and 46.37 for the 6 $\mu$m device.

Thus, as observed from comparing FIG. 9 with FIG. 10, the stress at the center of the active region has decreased for both the 1 $\mu$m and 6 $\mu$m device when these devices were sintered at a temperature of 400° C. for one minute. This comparison shows that by sintering, a bigger grain size is achieved as shown in FIG. 8 for example, and therefore an improved strain reduction cushion function is achieved. In addition, the data shown in FIG. 9 is obtained by an elastic calculation and the data shown in FIG. 10 is obtained by a plastic calculation. The present inventors have observed that the stress of the Au plated active region decreases due to the plastic transformation but the same stress does not decrease for an elastic transformation. Therefore, for the plastic transformation in this example, the stress of the plated 6 $\mu$m active layer has decreased from 54.684 MPa to 46.37 MPa.

Figure 11:
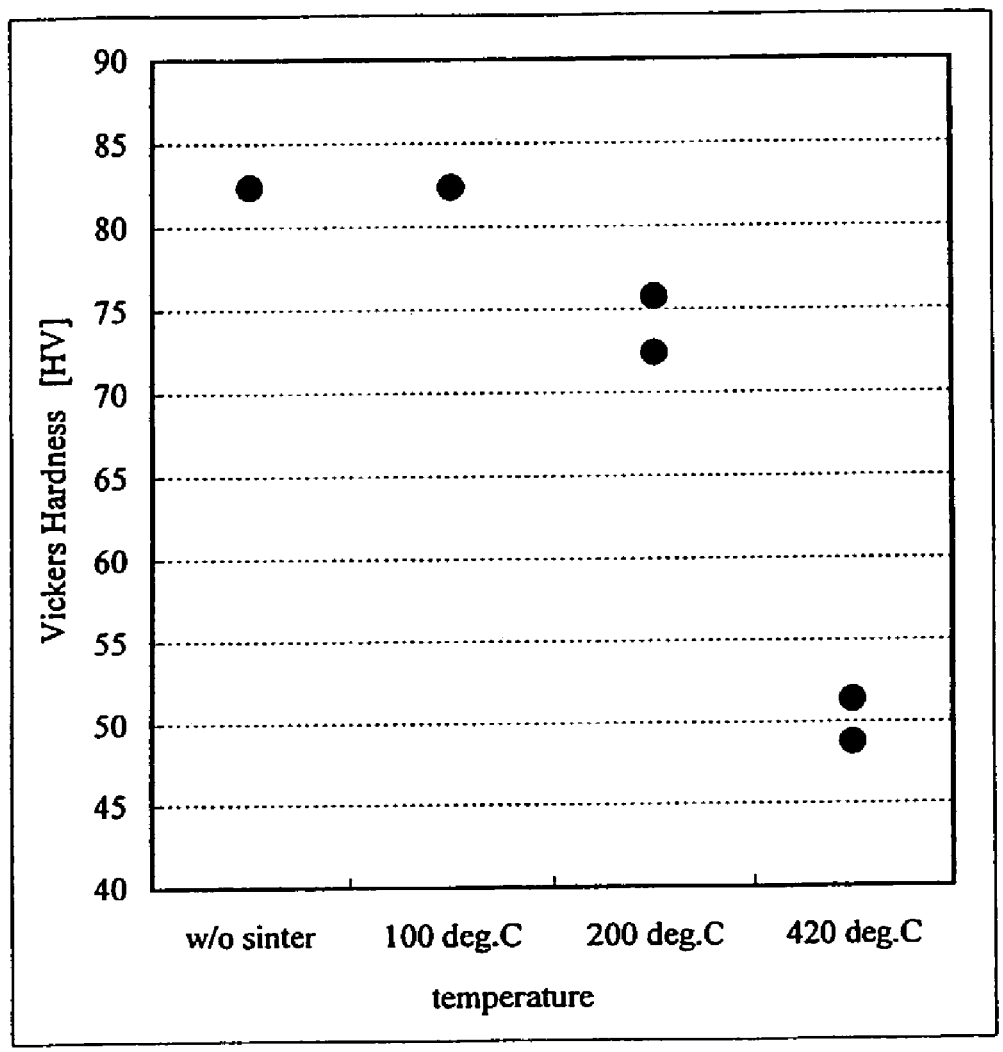
FIG. 11 is a graph illustrating a correlation between the vickers hardness and the sintering temperature of a material.

FIG. 11 is a graph showing the relationship between the hardness (vickers hardness) and the sintering temperature for Au. As noted on the graph, each sample was measured at two points under the conditions of a holding time of 15 seconds and a load of 10 gf. As seen in FIG. 11, the hardness of the material decreases with an increase of the sintered temperature. For the first embodiment it was observed that the metallic thin layer has a preferable hardness lower than 65, corresponding to a sintering temperature higher than 300° C. Many combinations of the sintering temperature and the holding time of the material at the respective sintering temperature may be produced.

Figure 12:
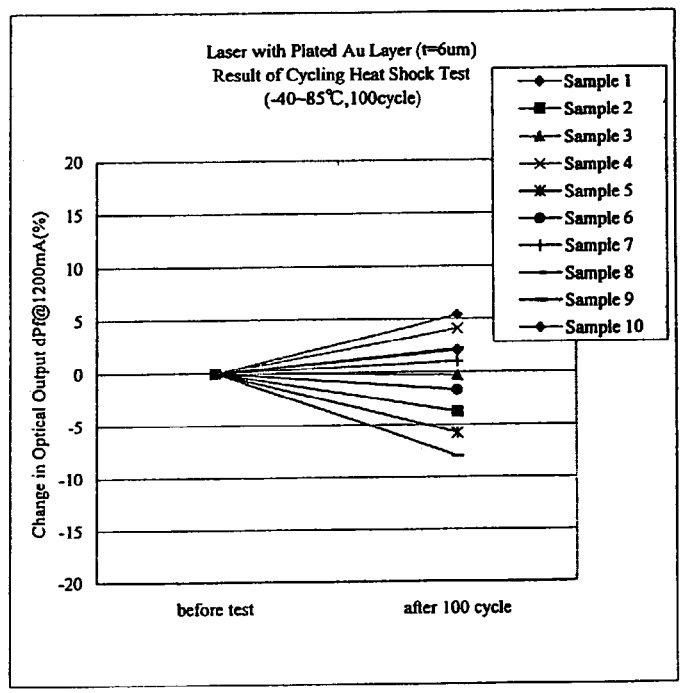
FIG. 12 is a graph showing a change in an optical output of the laser element due to the repetitive cycling heat where the metallic layer is Au plated.
Figure 13:
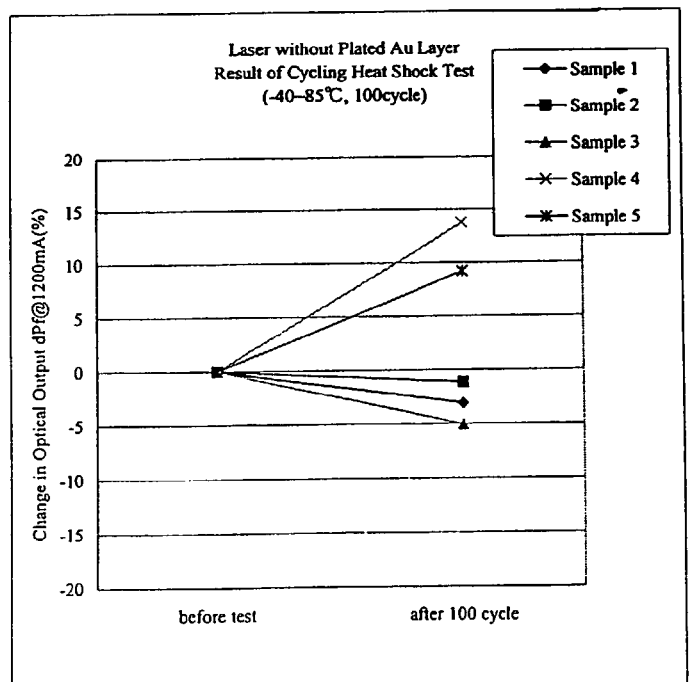
FIG. 13 is a graph showing a change in the optical output of the laser element due to the repetitive cycling heat, where the metallic layer is not Au plated.

FIGS. 12 and 13 present the results of a comparison between a laser device having an Au-based metallic thin layer and a semiconductor laser without the Au-based metallic thin layer. Specifically, FIG. 12 shows a change in optical output for 10 samples having a metallic thin film 15 of 6 $\mu$m and undergoing a 100 cycles heat shock test. The heat shock test included operating the laser device at a temperature of between −40 to 85° C., and then switching the laser device off. Then the laser device is again operated at the temperature of between −40 to 85° C. and then switched off, and so on for 100 cycles. FIG. 13 plots the same data as FIG. 12 for 5 samples not having a metallic film layer 15. As shown in FIGS. 12 and 13, the laser with the Au-based layer shows a smaller change in the optical output than the laser without an Au-based layer. Therefore, the laser plated with the Au-based layer advantageously operates at a more constant output than the laser without the Au-based plated layer. That is, the Au-based layer prevents the LDs from deteriorating. It is noted that a high quality laser produces the same optical output after a number of oscillation cycles and this results in a long life cycle.

Figure 14:
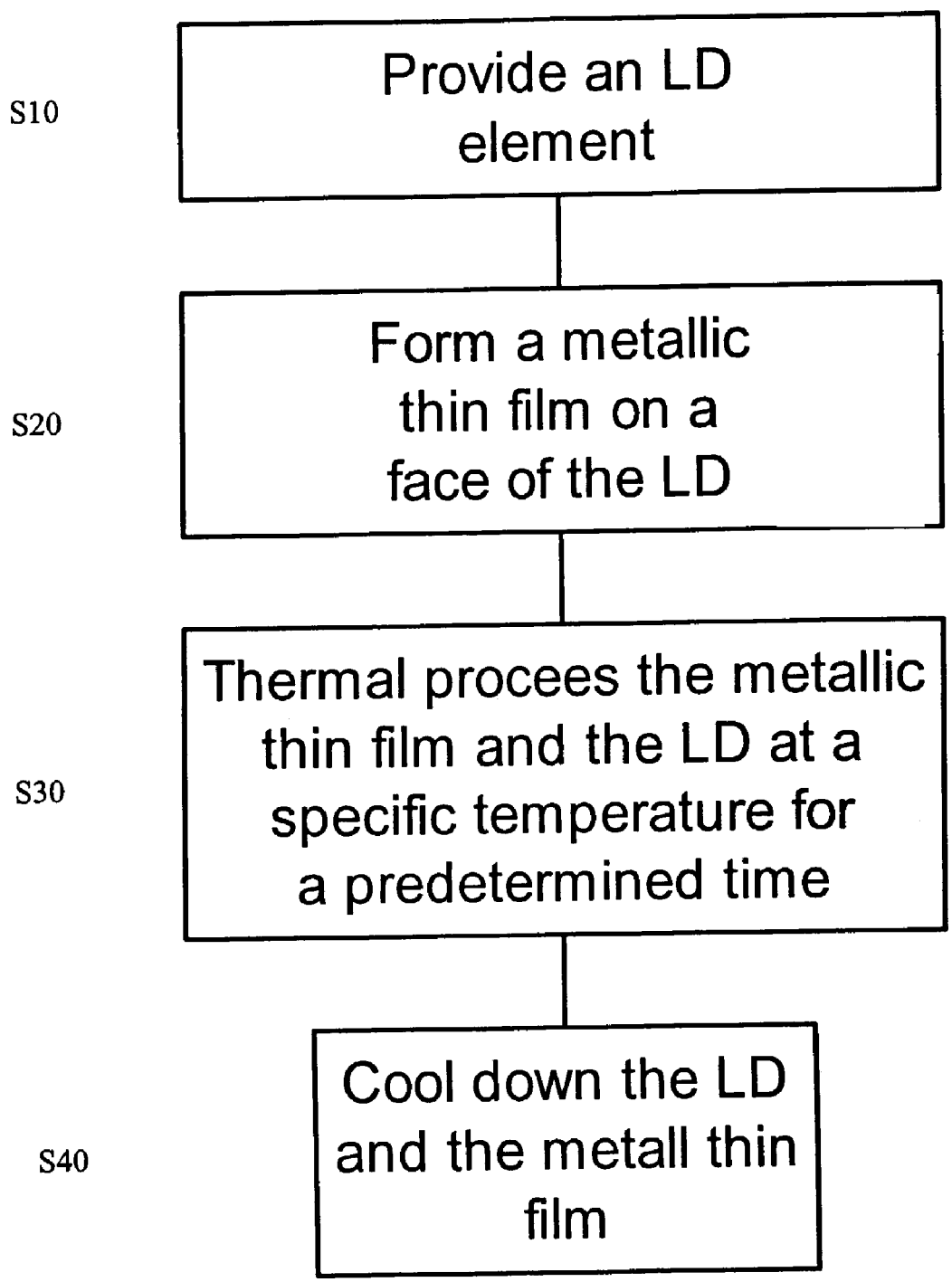
FIG. 14 is a flow chart showing steps for forming a sintered metallic thin film on a face of the semiconductor laser device.

FIG. 14 is a flow chart showing the steps for forming a thin metallic film on the face of a semiconductor laser element sintered at a specific temperature. In a first step S10, a p-type electrode is formed. In addition, a substrate is polished, and an n-type electrode is formed. For example, the p-type electrode, the n-type electrode and the polished substrate of step S10 are the elements of the semiconductor laser device element described in the first embodiment of the present invention. Other laser elements can be used to form the metallic thin film on its surface. In step S20, the metallic thin film is plated on a face of the p-type electrode. Various other methods may be used to form the metallic thin film on the surface of the p-type electrode, as electronic deposition, sputtering, or epitaxial process. Other processes can be used as well. The thickness of the metallic thin film formed by any of the methods described above should be at least 1 $\mu$m and preferably between 2 $\mu$m and 9 $\mu$m. The metallic thin film may include a plurality of metallic thin films and at least one thin film of the plurality of thin metallic films contains Au. It is preferable that any two adjacent films do not have an identical composition.

In step S30, after the metallic thin film has been formed on the surface of the p-type electrode, the p-type electrode, the metallic thin film and the n-type electrode are subjected to a thermal process. The thermal process is carried out, for example, in an oven where the temperature is increased gradually from the room temperature to a specific temperature, then the specific temperature is maintained for a predetermined time, and then the temperature in the oven is decreased back to the room temperature. It should be recognized that the profile of temperature versus time for this process can have various forms and the specific temperature, as described in FIGS. 3–8 is preferable above 300° C. The predetermined time for which the semiconductor laser device and the metallic thin film are kept at the specific temperature in the oven, is preferably in the order of tens of seconds. Any other device that permits a controlled temperature to be attained and maintained for the semiconductor laser element and the metallic thin film can be used instead of the oven used in the above example. As noted above, the thermal processing of the p-type achieves a higher grain size of the metallic thin film, therefore improving its cushion function.

In step S40, the temperature of the metallic thin film and the semiconductor laser elements is brought back to the room temperature and in this state the metallic thin film and the semiconductor laser elements are ready to be bonded together and either fixed to a submount or used in another laser model. The present inventors have recognized that this method of fabricating the semiconductor laser element advantageously reduces the number of steps effected after the substrate has been polished, in contrast to the conventional methods. It is know that after the wafers have been polished, the wafer is thin and predisposed to breaking when manipulated. In a conventional method, the p-type electrode is sintered alone after it is formed.

Then the substrate is polished, the n-type electrode is formed and sintered alone, and a low resistance layer is deposited on the p-type electrode. Finally, all the elements are bonded together to form a semiconductor laser device. Thus, the present method eliminates the steps of sintering alone the p-type and n-type electrodes and instead sinter the electrodes together with the metallic thin film deposited on the p-type electrode. In addition, the present method does sinter the metallic thin film for obtaining a bigger grain size, as the increased grain size achieves the cushion function.

Second Embodiment

Figure 15:
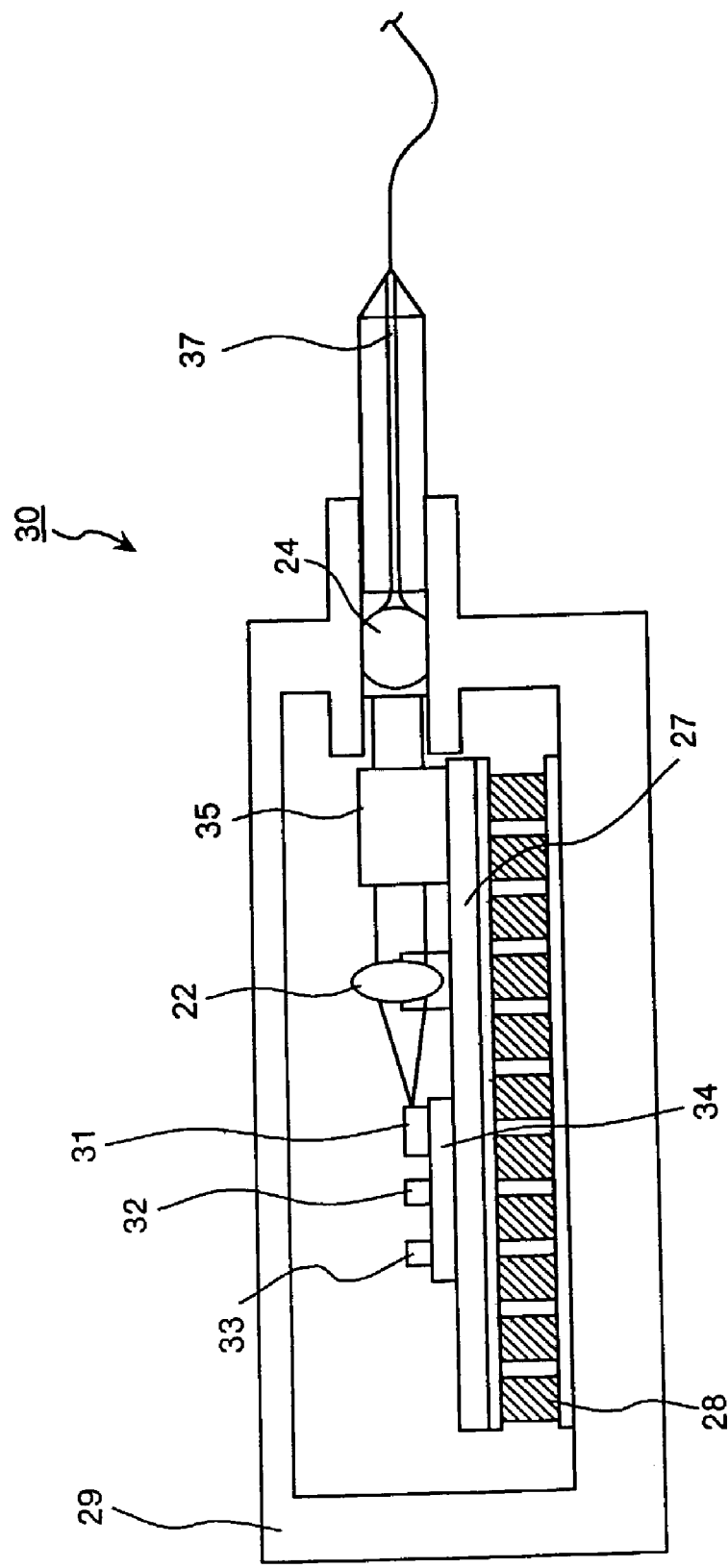
FIG. 15 is a sectional view which shows a structure of a semiconductor laser module.
Figure 16:
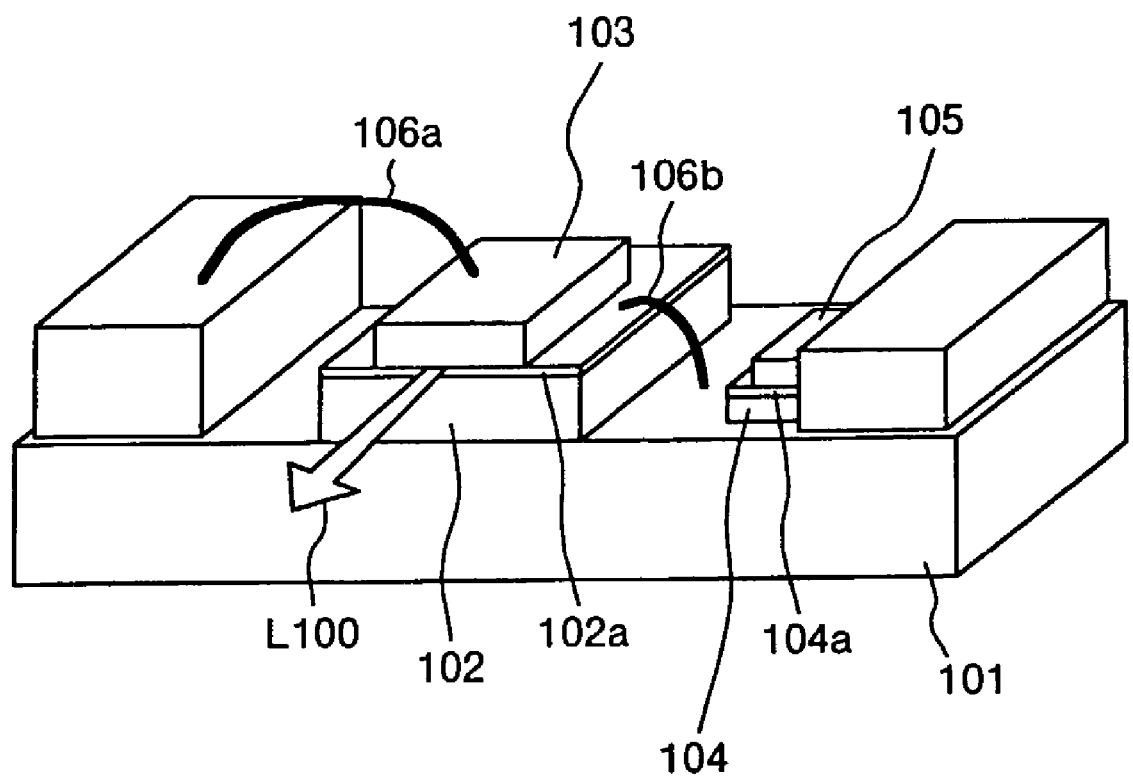
FIG. 16 is a perspective view which shows a schematic structure of a conventional semiconductor laser device.

A semiconductor laser module is described below. The semiconductor laser module of this embodiment is obtained by forming the semiconductor laser device of the first embodiment into a module. FIG. 15 is a sectional view which shows a structure of the semiconductor laser module of this embodiment. In FIG. 15, a semiconductor laser module 30 includes a package 29 formed by a copper-tungsten alloy as a housing. A Peltier module 28 functioning as a temperature controller is disposed on an inside bottom surface of the package 29. A base 27 is disposed on the Peltier module 28 and a carrier 34 is disposed on the base 27.

For example, in FIG. 15, a semiconductor laser device 31 corresponds to the semiconductor layer device shown in the first embodiment and the carrier 34 corresponds to the carrier 11 shown in FIG. 1. Therefore, the semiconductor laser device 31 is set on the carrier 34 and moreover, a thermistor 32 and an optical monitor 33 are arranged on the same carrier 34. Furthermore, a first lens 22 is disposed on the base 27. A laser beam emitted from the semiconductor laser device 31 is wave-guided into an optical fiber 37 through the first lens 22, an isolator 35, and a second lens 24. The second lens 24 is disposed inside the package 29. The second lens 24 is located on an optical axis of the laser beam produced by semiconductor laser device 31 and optically coupled with the optical fiber 37, externally-connected to the package 29. An optical monitor 33 monitors and detects a light leaking from a reflection film side of the semiconductor laser device 31. In the laser module 20, the isolator 35 is interposed between the semiconductor laser device 31 and the optical fiber 37 so that a reflected return light from another optical component is not input to a resonator again.

This embodiment uses a semiconductor laser module that directly outputs a laser beam emitted from the semiconductor laser device 31. However, it is also possible to apply this embodiment to a semiconductor laser module provided with an optical fiber grating which is formed near an end of the second lens 24 side of the optical fiber 37, to wavelength-selects and outputs a laser beam emitted from the semiconductor laser device 31 by the optical fiber grating. When the optical fiber grating is used, the isolator 35 is not necessary.

As described above, because the semiconductor laser module of this embodiment mounts the semiconductor laser device shown in the first embodiment, it is possible to provide a semiconductor laser module having the effects shown in the first embodiment.

As described above, according to a semiconductor laser device of the present invention, a lower electrode layer, a metallic thin film, a solder layer of a semiconductor laser element, and a metallic thin film on a submount are arranged in this order and each of these layers contain an Au-based material. Therefore, a strain reduction cushioning function, a low electric resistance, and a low thermal resistance between the semiconductor laser element and the submount are obtained, which in effect permit achieving a high radiation efficiency of the semiconductor laser element and the submount. Further, the above features determine a stable semiconductor laser device having a long service life.

According to a semiconductor laser device of the present invention, because a metallic thin film is formed between a lower electrode of a semiconductor laser element and a submount, on a recessed region of the lower electrode defined by a predetermined width, it is possible to reduce influences of a thermal strain applied to ends of the semiconductor laser element and prevent a deterioration and breakdown of the semiconductor laser element due to the heat generated in an active layer or the heat generated when fixing the semiconductor laser element onto the submount.

According to the semiconductor laser module, because the semiconductor laser device is mounted inside the semiconductor laser module, it is possible to obtain the same effects of the semiconductor laser device for the semiconductor laser module.

According to a semiconductor laser device fabrication method of the present invention, because a metallic thin film serving as a buffering layer between the laser element and the submount is formed on a semiconductor laser element, when a thermal processing is carried out, it is possible to increase the grain size of a material of the metallic thin film and improve the strain reducing cushioning function of the metallic thin film.

Although the invention has been described with respect to a specific embodiment for a complete and clear disclosure, the appended claims are not to be thus limited to that embodiment but are to be construed as embodying all modifications and alternative constructions that may occur to one skilled in the art which fairly fall within the basic teaching herein set forth.

What is claimed is:

1. A semiconductor laser device comprising:
a semiconductor laser element comprising an active layer disposed between first and second electrodes that inject a current into said active layer;
a first metallic thin film layer provided on a surface of the second electrode;
a submount having electric insulating and high thermal conductivity properties, said submount having a second metallic thin film layer provided on a surface of the submount; and
a solder layer configured to connect the first metallic thin film layer to the second metallic thin film layer,
wherein the second electrode, the first metallic thin film layer, the solder layer, and the second metallic thin film layer each comprises Au, and
wherein the second electrode, the first metallic thin film layer, the solder layer, and the second metallic thin film layer form a structure having a total thickness of 5 to 25 $\mu$m.

2. The semiconductor laser device of claim 1, wherein the second electrode layer is a multi-layer structure having a thickness of 0.5 $\mu$m or less.

3. The semiconductor laser device of claim 2, wherein the multilayer structure comprises a gold layer in contact with said first metallic thin film layer.

4. The semiconductor laser device of claim 1, wherein the first metallic thin film layer is an electrolytic plating film of substantially pure Au, and has a thickness of at least 1 $\mu$m.

5. The semiconductor laser device of claim 4, wherein the first metallic thin film layer has a thickness in the range of 2–9 $\mu$m.

6. The semiconductor laser device of claim 4, wherein the first metallic thin film layer has a thickness of about 6 $\mu$m.

7. The semiconductor laser device of claim 4, wherein the first metallic thin film layer comprises: a flat shape having a periphery recessed from a periphery of said second electrode, and has a convex portion on a light emitting end in a longitudinal direction of the laser device.

8. The semiconductor laser device of claim 4, wherein said first metallic thin film layer has a grain size of at least 1.5 $\mu$m.

9. The semiconductor laser device of claim 4, wherein said first metallic film layer has a vickers hardness of less than 65.

10. The semiconductor laser device of claim 1, wherein the solder layer has an eutectic temperature suitable to minimize a strain of said semiconductor laser element due to thermal expansion.

11. The semiconductor laser device of claim 10, wherein the solder layer comprises AuSn having a composition ratio Au:Sn in the range of 74–80:26–20.

12. The semiconductor laser device of claim 10, wherein said solder layer has a uniform thickness portion having a thickness of about 1 $\mu$m.

13. The semiconductor laser device of claim 1, wherein the second metallic thin film layer is a multi-layer structure having an Au layer with a thickness larger than the total thickness of the remaining layers of the multilayer structure.

14. The semiconductor laser device of claim 13, wherein said Au layer has a thickness of about 2 $\mu$m, and said total thickness is about 0.5 $\mu$m.

15. The semiconductor laser device of claim 1, wherein said submount is formed by diamond.

16. The semiconductor laser device of claim 1, wherein a cavity length is 800 $\mu$m or more.

17. The semiconductor laser device of claim 1, wherein a distance between the active layer and the second electrode is smaller than a distance between the active layer and the first electrode.

18. The semiconductor laser device of claim 17, wherein the distance between the active layer and the second electrode layer minimizes a stress of the active layer caused by thermal expansion.

19. A semiconductor laser device comprising:
a semiconductor laser element comprising an active layer disposed between first and second electrodes that inject a current into an active layer;
a first metallic thin film layer provided on a surface of the second electrode;
a submount having electric insulating and high thermal conductivity properties, said submount having a second metallic thin film layer provided on a surface of the submount; and
a solder layer configured to connect the first metallic thin film layer to the second metallic thin film layer,
wherein the second electrode, the first metallic thin film layer, the solder layer, and the second metallic thin film layer form a structure having a total thickness of (5–25) $\mu$m and a periphery of the first metallic thin film layer is recessed from a periphery of the second electrode layer by a predetermined amount.

20. The semiconductor laser device of claim 19, wherein the second electrode layer is a multi-layer structure having a thickness of 0.5 $\mu$m or less.

21. The semiconductor laser device of claim 20, wherein the multilayer structure comprises a gold layer in contact with said first metallic thin film layer.

22. The semiconductor laser device of claim 19, wherein the first metallic thin film layer is an electrolytic plating film of substantially pure Au, and has a thickness of at least 1 $\mu$m.

23. The semiconductor laser device of claim 22, wherein the first metallic thin film layer has a thickness in the range of 2–9 $\mu$m.

24. The semiconductor laser device of claim 22, wherein the first metallic thin film layer has a thickness of about 6 $\mu$m.

25. The semiconductor laser device of claim 22, wherein the first metallic thin film layer comprises a flat shape having a periphery recessed from a periphery of said second electrode, and has a convex portion on a light emitting end in a longitudinal direction of the laser device.

26. The semiconductor laser device of claim 22, wherein said first metallic thin film layer has a grain size of at least 1.5 $\mu$m.

27. The semiconductor laser device of claim 22, wherein said first metallic film layer has a vickers hardness of less than 65.

28. The semiconductor laser device of claim 19, wherein the solder layer has an eutectic temperature suitable to minimize a strain of said semiconductor laser element due to thermal expansion.

29. The semiconductor laser device of claim 28, wherein the solder layer comprises AuSn having a composition ratio Au:Sn in the range of 74–80:26–20.

30. The semiconductor laser device of claim 28, wherein said solder layer has a uniform thickness portion having a thickness of about 1 $\mu$m.

31. The semiconductor laser device of claim 19, wherein the second metallic thin film layer is a multi-layer structure having an Au layer with a thickness larger than the total thickness of the remaining layers of the multilayer structure.

32. The semiconductor laser device of claim 31, wherein said Au layer has a thickness of about 2 $\mu$m, and said total thickness is about 0.5 $\mu$m.

33. The semiconductor laser device of claim 31, wherein said remaining layers have a total thickness of about 0.5 $\mu$m.

34. The semiconductor laser device of claim 19, wherein said submount is formed by diamond.

35. The semiconductor laser device of claim 19, wherein a cavity length is 800 $\mu$m or more.

36. The semiconductor laser device of claim 19, wherein a distance between the active layer and the second electrode is smaller than a distance between the active layer and the first electrode.

37. The semiconductor laser device of claim 19, wherein the distance between the active layer and the second electrode layer minimizes a stress of the active layer caused by thermal expansion.

38. A semiconductor laser module comprising:
a semiconductor laser element comprising an active layer disposed between first and second electrodes that inject a current into said active layer;
a first metallic thin film layer provided on a surface of the second electrode;
a submount having electric insulating and high thermal conductivity properties, said submount having a second metallic thin film layer provided on a surface of the submount; and
a solder layer configured to connect the first metallic thin film layer to the second metallic thin film layer,
wherein the second electrode, the first metallic thin film layer, the solder layer, and the second metallic thin film layer each comprises Au, and
wherein the second electrode, the first metallic thin film layer, the solder layer, and the second metallic thin film layer form a structure having a total thickness of 5 to 25 $\mu$m;
a temperature-measuring element which measures a driving temperature of said semiconductor laser element; and
a temperature control element which controls a temperature of said semiconductor laser device in accordance with a temperature output from said temperature-measuring element, wherein
said submount is connected to an upper part of said temperature control element and the temperature of said semiconductor laser device is controlled through the submount.

39. A semiconductor laser module comprising:
- a semiconductor laser element comprising an active layer disposed between first and second electrodes that inject a current into an active layer;
- a first metallic thin film layer provided on a surface of the second electrode;
- a submount having electric insulating and high thermal conductivity properties, said submount having a second metallic thin film layer provided on a surface of the submount; and
- a solder layer configured to connect the first metallic thin film layer to the second metallic thin film layer, wherein a periphery of the first metallic thin film layer is recessed from a periphery of the second electrode layer by a predetermined amount, wherein the second electrode, the first metallic thin film layer, the solder layer, and the second metallic thin film layer each comprises Au, and wherein the second electrode, the first metallic thin film layer, the solder layer, and the second metallic thin film layer form a structure having a total thickness of 5 to 25 $\mu$m;
- a temperature-measuring element which measures a driving temperature of said semiconductor laser element; and
- a temperature control element which controls a temperature of said semiconductor laser device in accordance with a temperature output from said temperature-measuring element, wherein
- said submount is connected to an upper part of said temperature control element and the temperature of said semiconductor laser device is controlled through the submount.

* * * * *